United States Patent
Sekimoto

(10) Patent No.: US 7,164,304 B2
(45) Date of Patent: Jan. 16, 2007

(54) DUTY RATIO CORRECTION CIRCUIT

(75) Inventor: Yasuhiko Sekimoto, Hamamatsu (JP)

(73) Assignee: Yamaha Corporation, Hamamatsu (JP)

( * ) Notice: Subject to any disclaimer, the term of this patent is extended or adjusted under 35 U.S.C. 154(b) by 0 days.

(21) Appl. No.: 11/293,062

(22) Filed: Dec. 2, 2005

(65) Prior Publication Data

US 2006/0120119 A1    Jun. 8, 2006

(30) Foreign Application Priority Data

Dec. 3, 2004  (JP)  ............... 2004-351807

(51) Int. Cl.
*H03K 17/16*  (2006.01)
(52) U.S. Cl. ............ 327/281; 327/112; 327/391
(58) Field of Classification Search ........ 327/281, 327/112, 391, 387, 379
See application file for complete search history.

(56) References Cited

U.S. PATENT DOCUMENTS

| | | | |
|---|---|---|---|
| 5,023,472 A * | 6/1991 | Hashimoto et al. ......... 327/108 |
| 5,198,699 A * | 3/1993 | Hashimoto et al. ......... 327/108 |
| 5,668,488 A * | 9/1997 | Sharpe-Geisler et al. ... 327/108 |
| 5,764,091 A * | 6/1998 | Sumita et al. ............... 327/175 |
| 5,923,192 A * | 7/1999 | Hasegawa ................... 327/112 |
| 6,198,322 B1 * | 3/2001 | Yoshimura .................. 327/175 |
| 6,198,334 B1 * | 3/2001 | Tomobe et al. ............. 327/391 |
| 6,366,151 B1 * | 4/2002 | Nakamura ................... 327/281 |

FOREIGN PATENT DOCUMENTS

JP    01-70427 H    5/1989

* cited by examiner

*Primary Examiner*—Bao Q. Vu
(74) *Attorney, Agent, or Firm*—Pillsbury Winthrop Shaw Pittman LLP

(57) ABSTRACT

A duty ratio correction circuit includes: a first switching amplifier circuit into which an input pulse signal is input; a current control device connected with the switching device for controlling a current in accordance with a bias voltage signal; a waveform shaping circuit that correct an output of the first switching amplifier circuit; a first integration circuit that integrates a corrected output; a reference voltage setting unit that sets a reference voltage signal defining a duty ratio; a comparator circuit that compares an output of the first integration circuit with the reference voltage signal; a second switching amplifier circuit that includes a switching device connected in series with a constant current circuit, the switching device using a comparison judgment signal as a gate signal; and a second integration circuit that integrates an output of the second switching amplifier circuit and outputs the bias voltage signal.

2 Claims, 3 Drawing Sheets

DUTY RATIO CORRECTION CIRCUIT

BACKGROUND OF THE INVENTION

The present invention relates to a circuit for correcting a duty ratio of a pulse supplied from a pulse generator or the like.

Assume that an LSI (Large Scale Integration) performs processing with a clock generated by an PLL (Phase-Locked Loop) circuit or the like inside the chip of the LSI. Generally in this case, the PLL circuit or the like does not guarantee the duty ratio of the clock. It is therefore necessary to provide another means for generating a pulse with a desired duty ratio, for example, a duty ratio of 50% based on the generated clock.

In order to obtain a pulse with a duty ratio of 50% using an PLL circuit in the background art, for example, there has been used a technique in which an PLL output with a frequency twice as high as a desired frequency is generated, and the PLL output is divided to obtain a pulse with a duty ratio of 50%. According to this technique, it is possible to generate a pulse with a considerably accurate duty ratio. However, there occurs a disadvantage on design that power consumption increases to generate the PLL output with a frequency twice as high as a desired one.

For this reason, for example, a technique disclosed in JP-UM-H01-70427A. This technique will be described with reference to FIG. 3. An output of an oscillator 14 is put into a comparator 16 so as to be converted into a pulse signal CK shaped into a rectangular wave. This pulse signal CK is supplied to an output terminal 18 as a clock pulse. An integration circuit 24 constituted by a resistor 20 and a capacitor 22 integrates the pulse signal CK and generates a voltage signal QV indicating an average DC level of the pulse signal.

On the other hand, a volume circuit 28 serves to set a reference voltage BV defining the duty ratio. A comparator circuit 26 compares the voltage signal QV with the reference voltage BV and outputs a deviation between the both as an error signal EV. An integration circuit 34 constituted by a resistor 30 and a capacitor 32 integrates the error signal EV so as to generate a comparison signal CV and negatively feed the comparison signal CV back to the comparative 16. In such a manner, the voltage signal QV depending on the duty ratio of the pulse signal CK is negatively fed back to the comparator 16 so as to adjust the duty ratio of the clock pulse to a desired value.

Due to recent tendency to increase the speed of a clock pulse, the capacitor 22, 32 used in each integration circuit 24, 34 cannot help but having a large capacity to some degree. Thus, there occurs a problem that there is a limit in improvement of response so that the speed cannot be increased. In addition, when the technique is applied to a circuit inside an LSI, there occurs a problem that the chip area to form each capacitor 22, 32 increases.

SUMMARY OF THE INVENTION

In consideration of such a situation, an object of the present invention is to provide a circuit for correcting a duty ratio of a pulse supplied from a pulse generator or the like, in which a required capacity can be reduced so as to make the circuit suitable to be mounted on a semiconductor integrated circuit.

In order to solve the foregoing problems, a first aspect of the invention provides a duty ratio correction circuit comprising:

a first switching amplifier circuit including a switching device using an input pulse signal as a gate signal;

a current control device inserted and connected in series with the switching device and for controlling a current in accordance with a bias voltage signal;

a waveform shaping circuit for shaping a waveform of an output of the first switching amplifier circuit and outputting the shaped output as a corrected pulse signal;

a first integration circuit for integrating the corrected pulse signal;

a reference voltage setting unit for setting a reference voltage signal defining a duty ratio;

a comparator circuit for comparing an output signal of the first integration circuit with the reference voltage signal and outputting a comparison judgment signal;

a second switching amplifier circuit including a switching device connected in series with a constant current circuit, the switching device using the comparison judgment signal as a gate signal; and a second integration circuit for integrating an output of the second switching amplifier circuit and outputting the integrated output as the aforementioned bias voltage signal.

A second aspect of the invention provides a duty ratio correction circuit according to the first configuration, wherein a field-effect transistor is used as the current control device.

According to the invention, the output of the second integration circuit is used as the bias voltage signal to the current control device. Accordingly, there is an advantage that it is possible to suppress the current in the second integration circuit so that the capacitance in the second integration circuit can be reduced. Particularly when a high-impedance FET is used as the current control device, the aforementioned advantage becomes conspicuous.

Accordingly, good response is secured so that it is advantageous to support a high-speed clock. In addition, when the invention is applied to a circuit formed on a semiconductor substrate, there is an advantage in terms of the chip area.

DESCRIPTION OF PREFERRED EMBODIMENTS

An embodiment of the invention will be described below with reference to the drawings.

Figure 1:
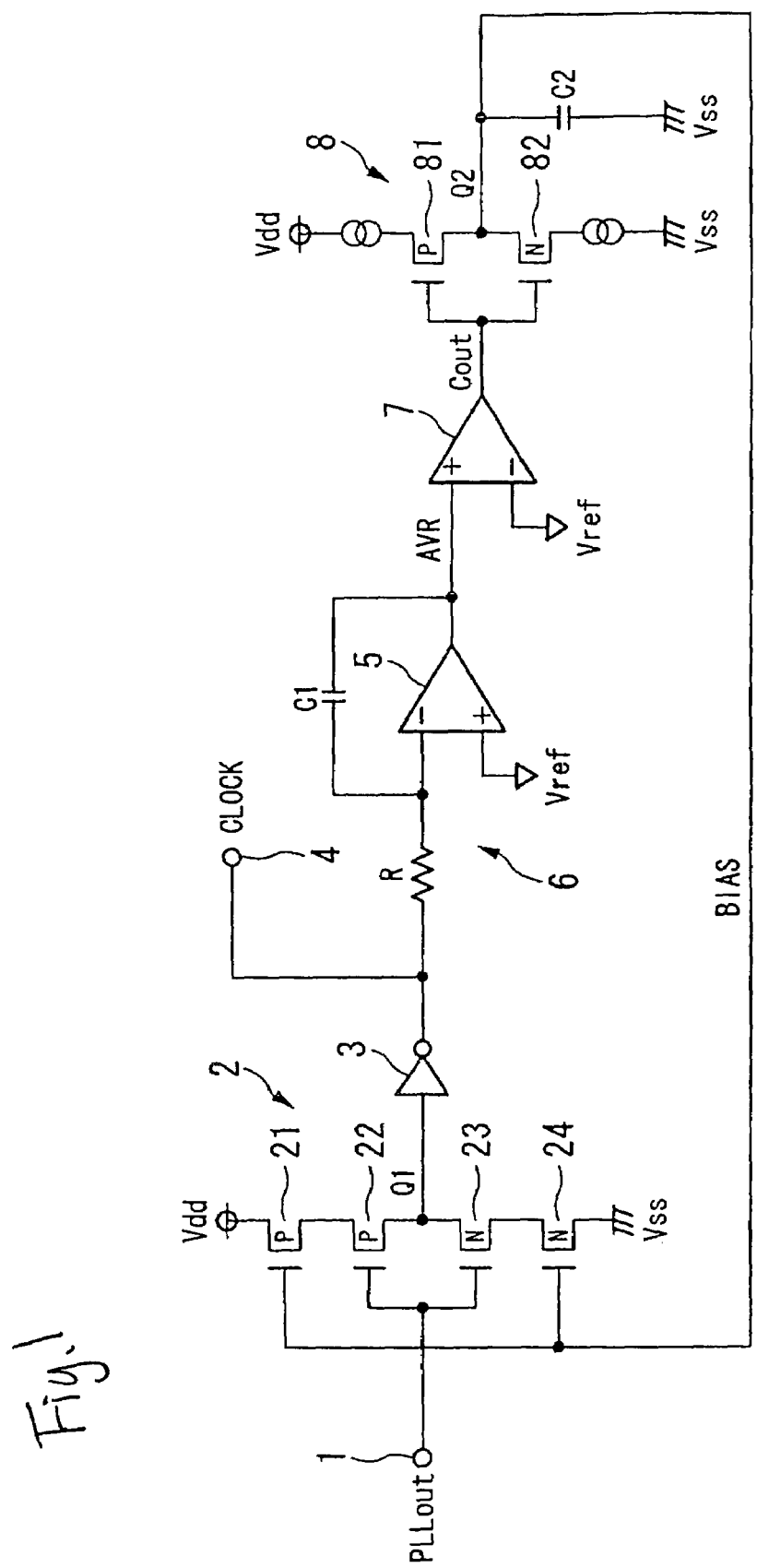
FIG. 1 is a block diagram showing the outline of a duty ratio correction circuit according to an embodiment of the invention.

FIG. 1 is a block diagram showing the outline of a duty ratio correction circuit according to an embodiment of the invention. An input terminal 1 is an input terminal to which an output PLLout of a PLL circuit (not shown) is inputted. A first switching amplifier circuit 2 is constituted by FETs (Field-Effect Transistors) 21–24 connected in series between a power supply voltage Vdd and a ground Vss. The first switching amplifier circuit 2 serves for switching amplification of PLLout and outputs the amplified PLLout.

The FETs 21 and 22 are P-channel FETs. The source of the FET 21 is connected to the power supply Vdd while the drain of the FET 21 is connected to the source of the FET 22. The drain of the FET 22 is connected to an output point Q1 while the gate of the FET 22 is connected to the input terminal 1. The FETs 23 and 24 are N-channel FETs. The drain of the FET 23 is connected to the output point Q1, the source of the FET 23 is connected to the drain of the FET 24 and the gate of the FET 23 is connected to the input terminal 1. The source of the FET 24 is connected to the ground.

The output point Q1 of the first switching amplifier circuit 2 is connected to an input terminal of an inverter 3. An output terminal of the inverter 3 is connected to an output terminal 4 for outputting a clock pulse to the outside.

One end of a resistor R is connected to the output terminal of the inverter 3 while the other end of the resistor R is connected to a negative input terminal of a differential amplifier 5. The differential amplifier 5 gains a difference in potential between its positive input terminal and its negative input terminal and outputs the difference. A reference voltage Vref (which will be described later) is put into the positive input terminal of the differential amplifier 5. A capacitor C1 is inserted and connected between an output terminal and the negative input terminal of the differential amplifier 5. An integrator 6 is constituted by the resistor R, the capacitor C1 and the differential amplifier 5.

A comparator 7 compares the potential of its positive input terminal and the potential of its negative input terminal and outputs a comparison result Cout. The comparison result Cout will be H (High level) if the potential of the positive input terminal is higher, and the comparison result Cout will be L (Low level) if the potential of the negative input terminal is higher. The output terminal of the differential amplifier 5 is connected to the positive input terminal of the comparator 7 while the reference voltage Vref (which will be described later) is put into the negative input terminal of the comparator 7.

A second switching amplifier circuit 8 is constituted by FETs 81 and 82 inserted and connected to a constant current circuit. The FET 81 is a P-channel FET. The source of the FET 81 is connected to an output point Q2 while the gate of the FET 81 is connected to the output terminal of the comparator 7. The FET 82 is an N-channel FET. The drain of the FET 82 is connected to the output point Q2 while the gate is connected to the output terminal of the comparator 7.

A capacitor C2 is inserted and connected between the output point Q2 of the second switching amplifier circuit 8 and the ground. The output point Q2 of the second switching amplifier circuit 8 is connected to the gates of the FETs 21 and 24. That is, the output of the second switching amplifier circuit 8 from which high-frequency components have been removed by the capacitor C2 is supplied to the gates of the FETs 21 and 24 as a bias signal BIAS.

A fundamental operation of this circuit will be described next. The FETs 22 and 23 perform switching operation using. PLLout input from the input terminal 1 so that a signal in which PLLout has been delayed is generated in the output point Q1 of the first switching amplifier circuit 2. The time between the rising edge of the pulse signal and the trailing edge thereof in the output point Q1 is adjusted by the bias signal BIAS supplied to the FETs 21 and 24 so that the pulse width is expanded or contracted. The waveform of this signal is shaped by the inverter 3 and then output from the output terminal 4 as a clock pulse CLOCK.

The output of the inverter 3 is averaged and converted into an averaged signal AVR by the integrator 6. The averaged signal AVR is a signal whose level depends on the duty ratio of the clock pulse CLOCK. That is, there is a relationship as:

Duty<50%: $AVR<Vdd/2$

Duty=50%: $AVR=Vdd/2$

Duty>50%: $AVR>Vdd/2$

A reference voltage Vref defining a reference duty ratio is supplied to the comparator 7. For example, when the reference duty ratio is 50%, the reference voltage Vref is set at the following value.

$Vref=Vdd/2(=Vdd\times 50\%)$

The comparator 7 compares the averaged signal AVR with the reference voltage Vref and outputs a comparison result Cout. This comparison result is set as:

Duty<50%: $Cout=L$(Low level)

Duty>50%: $Cout=H$(High level)

The second switching amplifier circuit 8 operates in accordance with the comparison result Cout. Thus, in the output point Q2, a DC component appears only in the period of Cout=H. This DC component is rectified by a low pass filter constituted by the capacitor C2. Thus, the bias signal BIAS is obtained.

Figure 2:
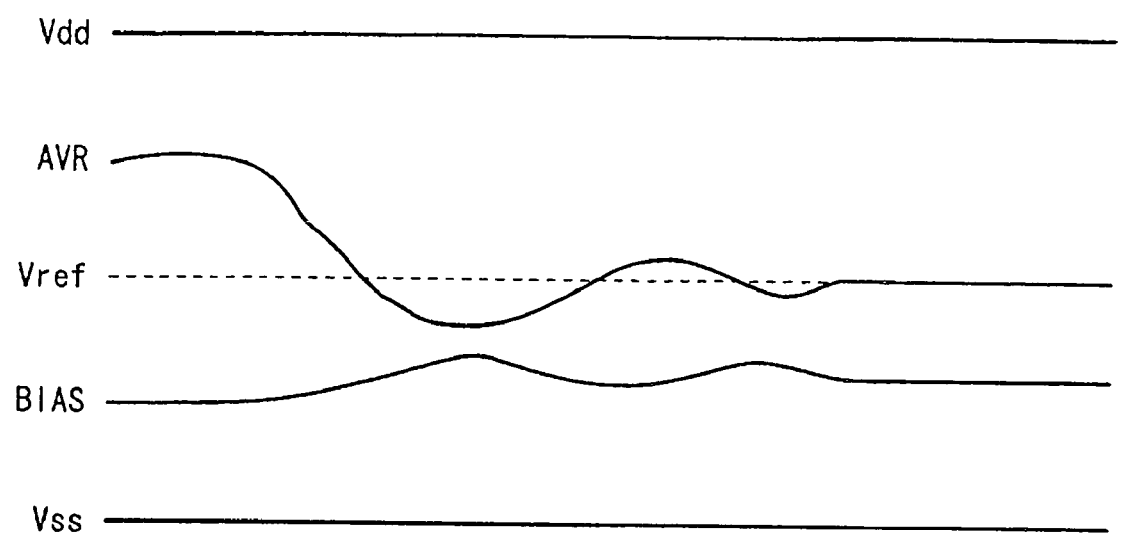
FIG. 2 is a time chart showing the states of an averaged signal AVR and a bias signal BIAS in a case where the duty ratio of PLLout is lower than 50%.
Figure 3:
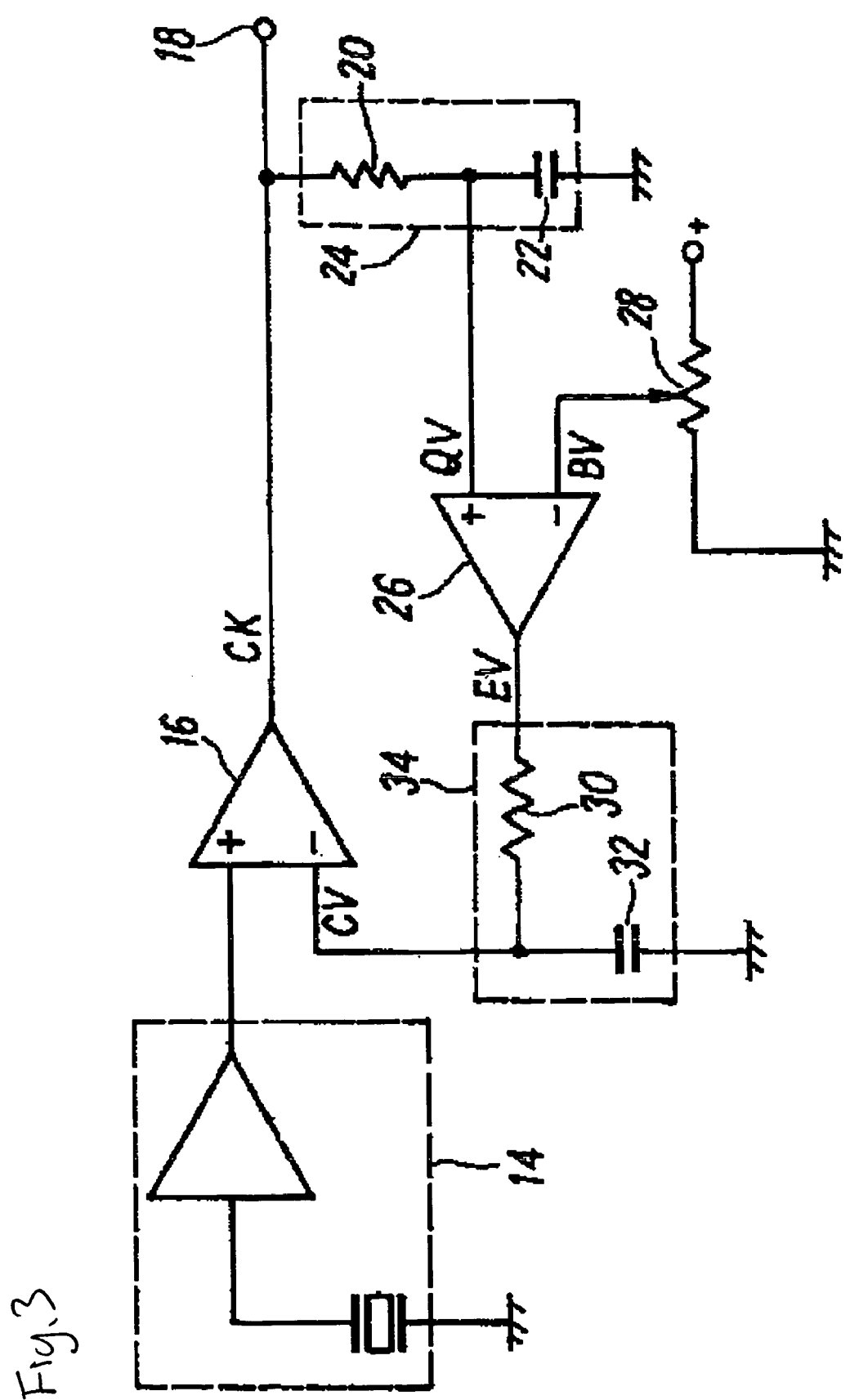
FIG. 3 is a block diagram for explaining an related art.

Here, assume the case where the duty ratio of PLLout put into the input terminal 1 is lower than 50%. FIG. 2 is a time chart showing the states of the averaged signal AVR and the bias signal BIAS, showing the case where the duty ratio of PLLout is lower than 50%.

The operation of this circuit in such a case will be described with reference to FIGS. 1 and 2. The duty ratio of a signal in the output point Q1 of the first switching amplifier circuit 2 is lower than 50%. The clock pulse CLOCK is obtained by inverting this signal in the output point Q1. Therefore, the duty ratio of the clock pulse CLOCK is higher than 50%. Thus, the level of the averaged signal AVR is higher than Vdd/2. As a result, the output Cout of the comparator 7 is H. Thus, the second switching amplifier circuit 8 is turned on so that the bias signal BIAS becomes higher gradually.

When the bias signal BIAS is higher, the time between the rising edge of the pulse signal and the trailing edge thereof in the output point Q1 is prolonged so that the pulse width is corrected to be expanded. As a result, the clock pulse CLOCK output by the inverter 3 is corrected so that its duty ratio is lowered to approach 50%.

This embodiment uses a technique in which a deviation of the duty ratio is fed back as the bias signal BIAS to the FETs 21 and 24. Accordingly, the current in the low pass filter constituted by the capacitor C2 can be suppressed so that the capacitance of the capacitor C2 can be reduced. Therefore, there is an advantage that a circuit superior in response can be arranged to support a higher speed of the clock pulse. In addition, when the embodiment is applied to a circuit arranged on an LSI, there is an advantage in terms of reduction in chip area.

Although the embodiment of the invention has been described above in detail, its specific configuration is not limited to this embodiment. The invention also includes other designs or the like without departing from the spirit and scope of the invention.

For example, although a mode in which the circuit operates based on the output of the PLL circuit has been taken in the embodiment, the invention is not limited to such a mode. The invention may be carried out by a mode in which the circuit operates based on an input received from a crystal oscillator output etc. Although a mode in which the reference duty ratio is set at 50% with Vref=Vdd/2 has been shown, the reference voltage Vref can be set desirably in accordance with a required value of the duty ratio.

What is claimed is:

1. A duty ratio correction circuit comprising:
  a first switching amplifier circuit that includes a switching device into which an input pulse signal is input as a gate signal;
  a current control device that is connected in series with the switching device for controlling a current in accordance with a bias voltage signal;
  a waveform shaping circuit that shapes a waveform of an output of the first switching amplifier circuit and outputs the shaped output as a corrected pulse signal;
  a first integration circuit that integrates the corrected pulse signal;
  a reference voltage setting unit that sets a reference voltage signal defining a duty ratio;
  a comparator circuit that compares an output signal of the first integration circuit with the reference voltage signal and outputs a comparison judgment signal;
  a second switching amplifier circuit that includes a switching device connected in series with a constant current circuit, the comparison judgment signal is input to the switching device as a gate signal; and
  a second integration circuit that integrates an output of the second switching amplifier circuit and outputs the integrated output to the current control device as the bias voltage signal.

2. The duty ratio correction circuit according to claim 1, wherein the current control device includes a field-effect transistor.

* * * * *